United States Patent
Polishchuk et al.

(10) Patent No.: US 7,678,640 B1
(45) Date of Patent: Mar. 16, 2010

(54) METHOD OF THRESHOLD VOLTAGE CONTROL IN METAL-OXIDE-SEMICONDUCTOR DEVICES

(75) Inventors: Igor Polishchuk, Fremont, CA (US); Oliver Pohland, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 621 days.

(21) Appl. No.: 11/452,649

(22) Filed: Jun. 14, 2006

Related U.S. Application Data

(60) Provisional application No. 60/694,473, filed on Jun. 28, 2005.

(51) Int. Cl.
*H01L 21/336* (2006.01)
(52) U.S. Cl. .................. 438/217; 438/289; 438/525
(58) Field of Classification Search .......... 438/199, 438/510, 514, 526, 546, 549, 217, 218, 519, 438/525, 527, 531, 910, 914, 289, 290
See application file for complete search history.

(56) References Cited

U.S. PATENT DOCUMENTS

| | | | |
|---|---|---|---|
| 5,593,907 A | 1/1997 | Anjum et al. | |
| 5,874,329 A | 2/1999 | Neary et al. | |
| 6,458,656 B1 * | 10/2002 | Park et al. | 438/257 |
| 6,797,592 B2 * | 9/2004 | Brown et al. | 438/510 |
| 7,232,744 B2 * | 6/2007 | Ghneim et al. | 438/519 |
| 2002/0022297 A1 * | 2/2002 | Tanabe | 438/60 |

OTHER PUBLICATIONS

Ng, Kwok K. Complete Guide to Semiconductor Devices Second Edition. New York: John Wiley & Sons, Inc. 2002. pp. 175-177.*
Wolf, S. and Tauber, R.N. Silicon Processing for the VLSI Era vol. 1—Process Technology. California: Lattice Press. 1986. pp. 407-408.*
Terrence B. Cook, Lateral Ion Implant Straggle and Mask Proximity Effect, IEEE Transaction On Electorn Devices, vol. 50, No. 9, Sep. 2003.
Well-Proximity Model, presentation presented Dec. 16, 2004 of the Compact Model Counsel meeting of the Government Electronics & Information Technology Association. Downloaded on Jul. 6, 2006 from: http://www.eigroup.org/cmc/minutes/121604_presentations/tsmc_proposal_well_prox_cmc_1129.ppt.

* cited by examiner

*Primary Examiner*—Kevin M Picardat

(57) ABSTRACT

Methods are provided for manufacturing a semiconductor circuit on a substrate of a first conductivity type to control threshold voltages of devices in the circuit. One method involves: (i) forming a photoresist mask on a surface of the substrate defining a well boundary around an area in which a well is to be formed; (ii) implanting ions into the substrate to form a well of a second conductivity type, wherein a region proximal to the well boundary is effected by lateral scattering of the ions by the mask; and (iii) forming a channel of a device, at least a portion of the channel formed in the region proximal to the well boundary, wherein the ions are implanted at an acute angle to the surface substrate to shadow the portion of the channel from at least some of the ions implanted to form the channel. Other embodiments are also provided.

15 Claims, 5 Drawing Sheets

METHOD OF THRESHOLD VOLTAGE CONTROL IN METAL-OXIDE-SEMICONDUCTOR DEVICES

CROSS-REFERENCE TO RELATED APPLICATIONS

The present application claims the benefit of priority under 35 U.S.C. 119(e) to U.S. Provisional Patent Application Ser. No. 60/694,473, filed Jun. 28, 2005, entitled Method of Threshold Voltage Control in Metal-Oxide-Semiconductor Devices; which application is hereby incorporated by reference.

TECHNICAL FIELD

This invention pertains generally to the fabrication of a semiconductor devices, and more particularly, to a method of controlling threshold voltage in MOS devices through the elimination of a well boundary proximity effect.

BACKGROUND OF THE INVENTION

Referring to FIG. 1, as is well-known in the art, Complementary Metal Oxide Semiconductor (CMOS) circuits consist of N-channel and P-channel MOS transistors formed in separate N and P wells 102 on a surface 104 a semiconductor substrate 106. MOS transistors use a gate to control the underlying surface channel 108 joining a source and a drain (not shown in this figure). The channel 108, source and drain are located in the well 102, with the source and drain being doped oppositely to the channel and the well. The circuit may further include a number of isolation features 110, such as shallow trenches filled with a dielectric or field oxide, to electrically isolate devices formed within the well.

The N and P wells 102 are typically formed by axially implanting ions 112 of the appropriate species at high energies in to the surface 104 of the substrate 106 in a region surrounded or defined by a thick (>1 μm thick) photoresist (PR) mask 116. The channels 108 are typically formed by implanting the surface 104 at a low energy. The dose or concentration of dopants implanted into the channel 108 generally determines the threshold voltage ($V_T$) of the finished device. The $V_T$ is the minimum gate voltage required to turn on or induce conductance in the channel 108 of the device. For enhancement-mode devices, the positive gate voltage of an N-channel device must be larger than some threshold voltage before a conducting channel is induced, and the negative gate voltage of a P-channel device must be more negative than some threshold voltage to induce the required positive charge (mobile holes) in the channel.

Although the above approach has worked well in the past, as device geometries scale, problems such as "well boundary proximity effects" are encountered. Referring to FIG. 1, well boundary proximity effects occur, for example, when ions 112a are scattered from the edge of PR mask 116 during well implantation rather than being blocked or trapped as desired, thereby raising or increasing the concentration of dopant in the channel region of devices near the well boundary. Although this increase in the concentration of dopants has substantially no impact on the operation of devices having relatively large channel width (W) and the devices located far from the well boundary, it becomes significant as channel widths and the well-to-well spacing are reduced into the deep sub-micron range. A graph illustrating the impact of a well boundary effect on $V_T$ as a function of channel width (W) is shown in FIG. 2. The top graph, labeled 202, illustrates the effect on devices near the well boundary. The lower graph, labeled 204, illustrates the effect on devices distant from the well boundary. Referring to FIG. 2, the cumulative effect of this added doping coupled with that of the conventional channel implant is to raise the $V_T$ of devices formed near the drawn well boundary as channel width (W) decreases. In the example, shown it is seen that $V_T$ has been shifted by about 60 mV for a narrow channel device near the drawn well boundary.

Various methods for controlling or compensating for $V_T$ variation through design and processing techniques are known in the prior art.

One prior art technique or method requires designers to take variations in $V_T$ due to the Well boundary proximity effects into account during the design stage using a physical layout of the circuit and a series of complex modeling equations. That is the variation in $V_T$ due to the Well boundary proximity effects are estimated using modeling equations, and the modified accordingly to allow for these variations.

It will be appreciated that this approach is not wholly satisfactory for a number of reasons including the complexity of the model from which the designers must work. Also, there is the added cost and time arising from the need for multiple iterations in designing a circuit, since each change in the circuit layout would typically result in a change in $V_T$s of the devices.

Another technique, not shown, involves an additional compensating threshold adjust implant of all or part of the channel performed just before forming the gate to adjust the doping concentration in the channel region near the well boundary. However, this approach undesirably requires additional photolithography and/or implant steps, and compensation may degrade device performance.

Accordingly, there is a need for a method of controlling $V_T$ in MOS devices near the drawn well boundary through the elimination of a well boundary proximity effect. There is a further need for a method of independently adjusting the $V_T$'s of specific narrow channel transistors to enhance circuit performance. It is desirable that these methods do not require additional photolithography and/or implant steps. It is still further desirable that the methods are substantially immune to mask misalignment in the well and channel implant steps.

The present invention provides a solution to these and other problems, and offers further advantages over conventional methods of designing and fabricating CMOS devices and circuits.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

The present invention is directed generally to methods of designing and fabricating semiconductor devices and circuits. Methods of the present invention are particularly useful in fabricating Complimentary Metal Oxide Semiconductor (CMOS) circuits including devices formed near a well boundary, which would in conventional processes be impacted by laterally scattered dopants from an ion implant used to form the well.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly connect and to indirectly connect through one or more intervening components.

In a first aspect of the present invention a method is provided for manufacturing a circuit on a semiconductor substrate to minimize or eliminate impact of a well boundary effect on threshold voltage ($V_T$) of devices in the circuit formed proximal to a well boundary.

As noted above, CMOS circuits utilize separate N and P wells in a semiconductor substrate in which devices, such as MOS Field Effect Transistors (MOSFETs), of the circuit are formed. Generally, the substrate is of a first conductivity type, P or N, and may serve as one of the wells. The other well is formed by implanting ions or impurities of a second conductivity type at a moderate concentration and a moderate distance below as surface of the substrate.

Figure 1:
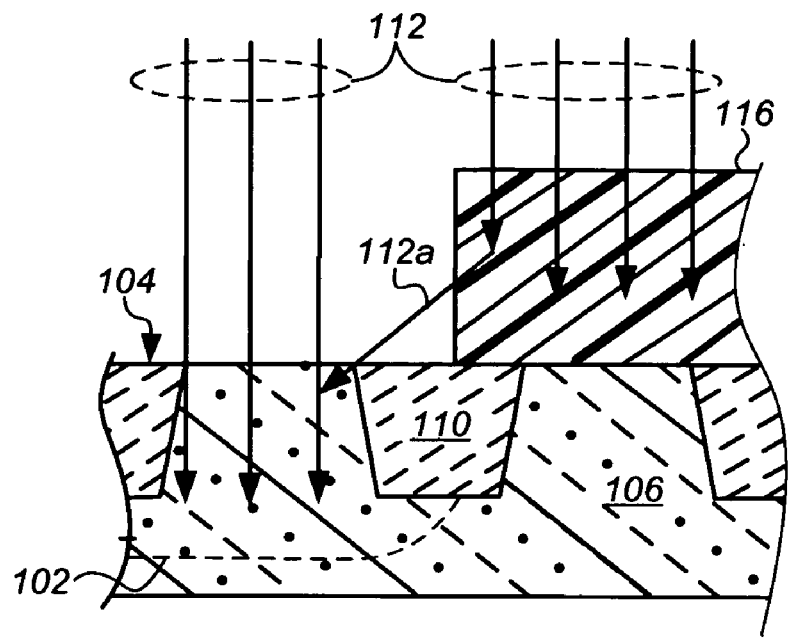
FIG. 1 (prior art) is a block diagram illustrating a sectional side view of a portion of a substrate undergoing an axial well implant near the well boundary.
Figure 2:
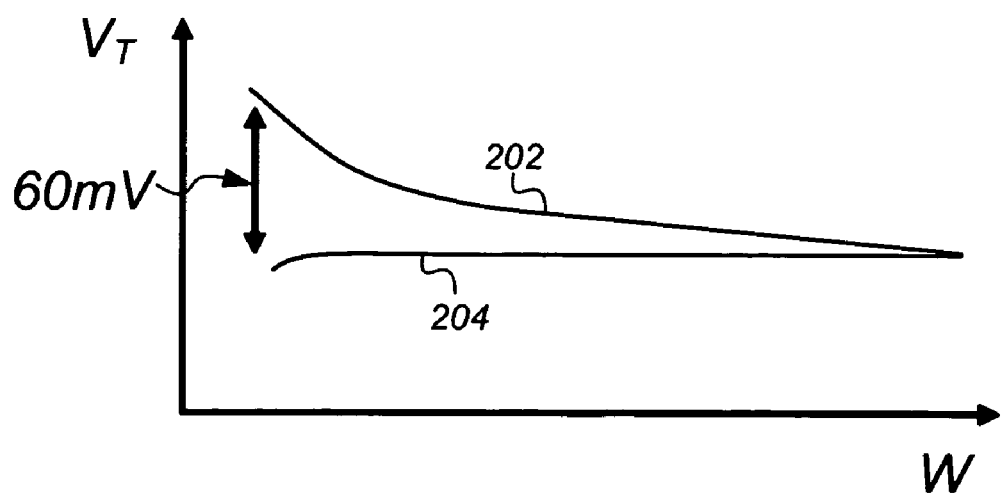
FIG. 2 (prior art) is a graph illustrating the impact of a well boundary effect on threshold voltage ($V_T$) as a function of channel width (W)
Figure 3:
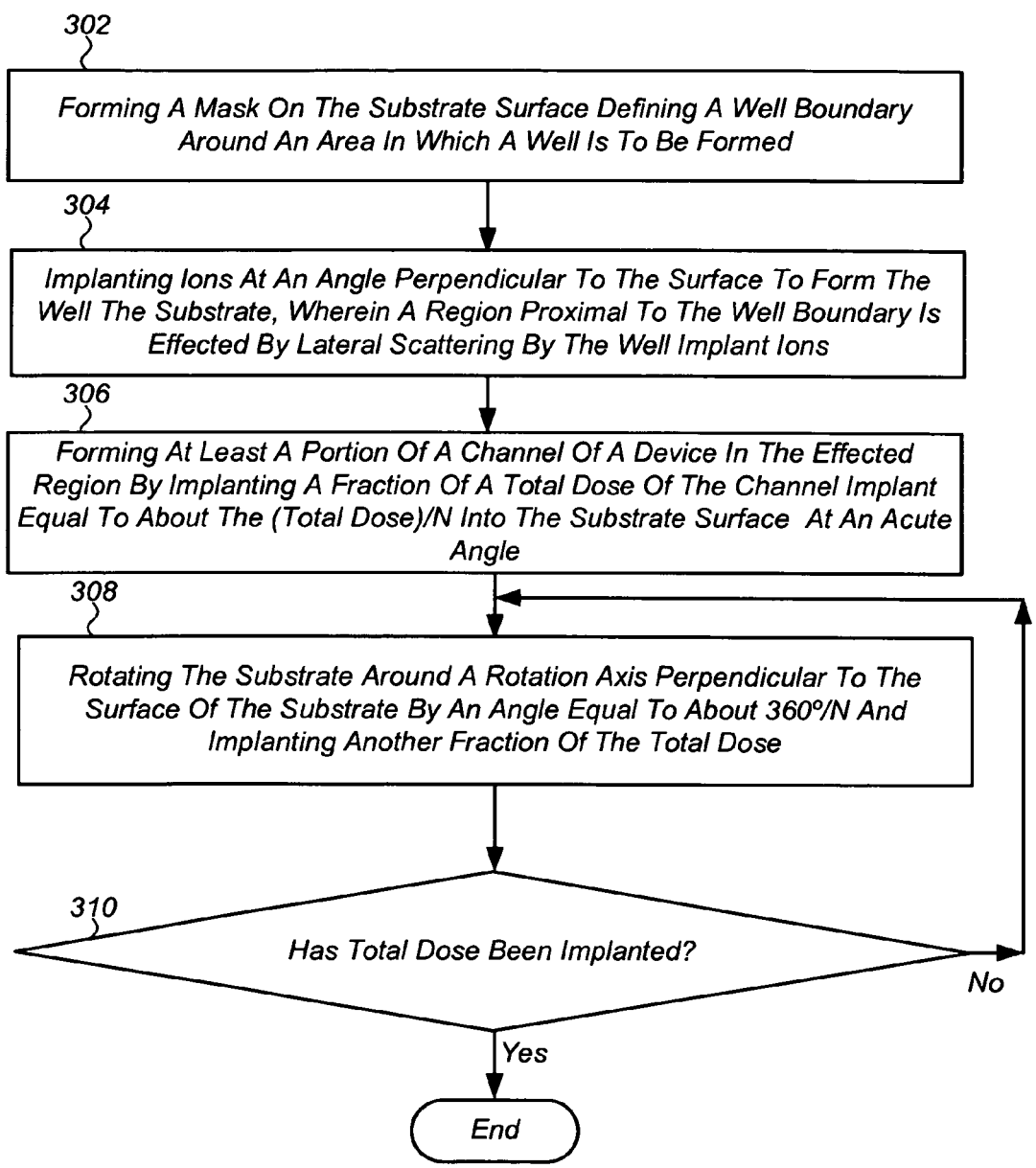
FIG. 3 is a flowchart of a method for manufacturing a circuit on a semiconductor substrate to control $V_T$ of devices in the circuit proximal to a well boundary according to an embodiment of the present invention.
Figure 4A:
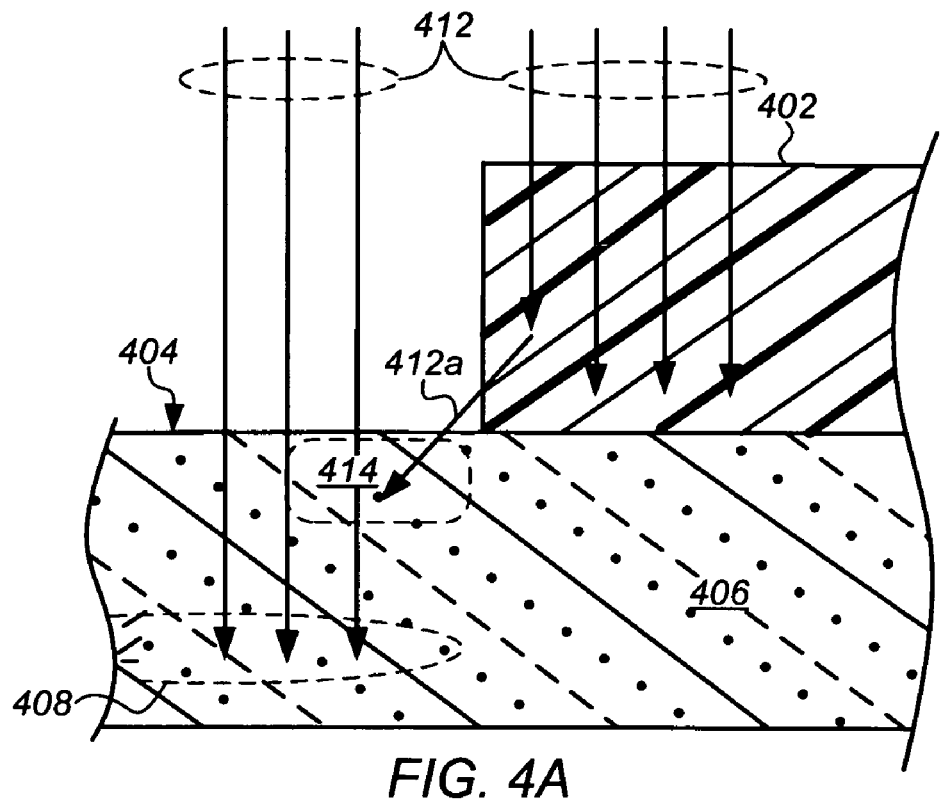
FIG. 4A is a block diagram illustrating a sectional side view of a portion of a substrate near a well boundary undergoing an axial well implant to form the well according to an embodiment of the present invention.
Figure 4B:
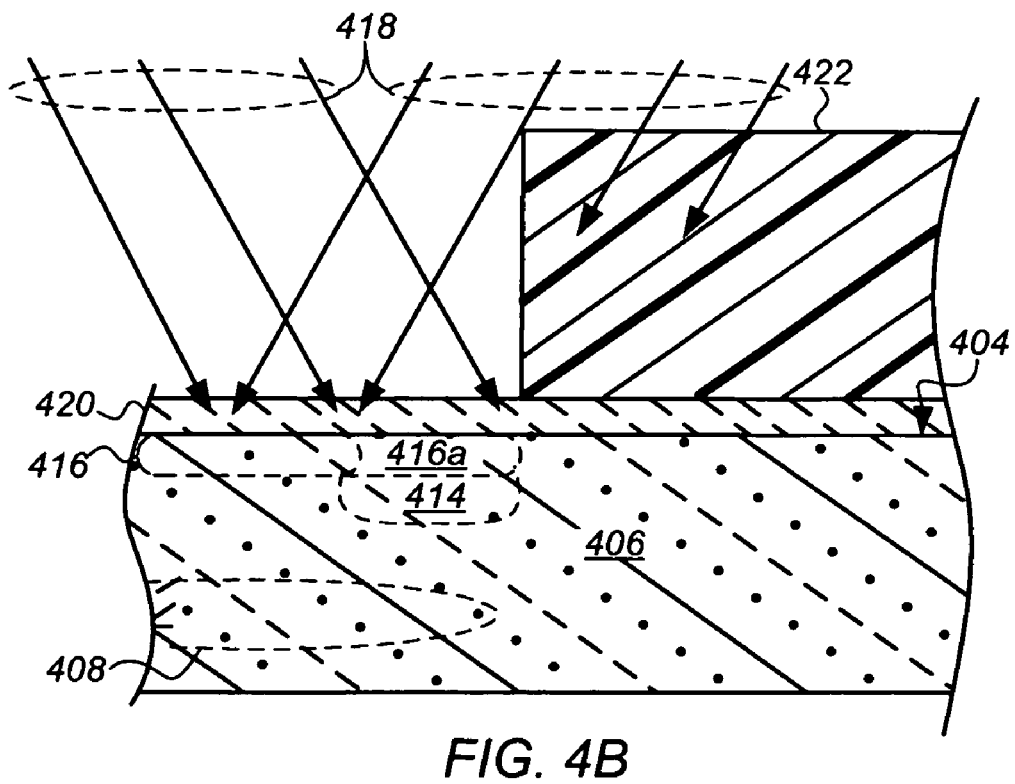
FIG. 4B is a block diagram illustrating a sectional side view of a portion of a substrate near the well boundary undergoing an angled or tilted channel implant according to an embodiment of the present invention.

A first embodiment will now be described in greater detail with reference to FIGS. 3 through 5. FIG. 3 is a flowchart of a method for manufacturing a circuit on a semiconductor substrate to control $V_T$ of devices in the circuit proximal to a well boundary. FIGS. 4A and 4B are block diagrams illustrating a sectional side view of a portion of a substrate near a well boundary. For purposes of clarity, many of the details of semiconductor fabrication that are widely known and are not relevant to the present invention have been omitted from the following description.

Referring to FIGS. 3 and 4A, in a first step (step 302) a first photoresist (PR) mask 402 or well mask is formed on a surface 404 of a substrate 406 to define a well boundary around an area in which an N or P type well 408 is to be formed. The PR mask 402 is formed using standard photolithographic process from a reticule (not shown) having a drawn well boundary located a predetermined distance from the nearest devices or features of devices to be formed in the well 408. The substrate 406 may include any conventionally known semiconductor material, such as Silicon, Gallium-arsenide, Germanium, Gallium-nitride, Aluminum-phosphide, or mixtures thereof.

Next, dopants to form the desired type of well 408 are ionized and implanted into the area of the substrate 406 defined by the PR mask 402 (step 304). Dopants implanted to form an N type well (Nwell) may include, for example, Arsenic ($As^+$) or Phosphorous ($P^+$). Dopants implanted to form a P type well (Pwell) may include Boron ($B^+$). For example, where the substrate 406 is a P type substrate Nwells 408 may be formed therein by implanting $B^+$ ions 412 at energy of from about 50 to about 500 KeV, and to a concentration or dose of from about 1e12 to about 1e14 $cm^{-3}$.

In one embodiment, the well 408 is formed by axially implanting ions into the substrate 404. By axially implanting it meant that the ions 412 are accelerated toward the substrate 406 at an angle substantially perpendicular to the surface 404 thereof. As shown in FIG. 4A, some ions 412a of the axial well implant are laterally scattered by the PR mask 402 into a region 414 near or proximal to the defined well boundary raising a concentration or doping in near the surface 404 of the substrate 406 in the region. This additional doping from the latterly scattered ions 412a can impact the threshold voltage or $V_T$ of devices subsequently formed in the well 408, and having at least a portion of a channel formed in the region 414. In particular, the additional doping can significantly raise the $V_T$ of narrow channel devices having a channel formed in the region 414 near the boundary of the well 408. By narrow channel devices it is meant a device having a channel length of less than about 0.5 μm.

Referring to FIG. 4B, in accordance with the present invention a channel 416 of a device, at least a portion 416a of which is formed in the region 414 proximal to the well boundary, is formed by implanting ions 418 into the substrate 406 at an acute angle to the surface 404 or to a normal or perpendicular axis of the surface. In one embodiment, shown in FIG. 4B, the channel implant 416 can be performed by implanting through a screen oxide layer 420, which is subsequently stripped or removed prior to forming a gate structure (not shown) of the device. Use of a screen oxide layer 420 is desirable to adjust the depth of the channel implant with respect to the silicon surface.

In an alternative embodiment, not shown, a screen oxide layer 420 is not used but the channel implant is performed after forming and patterning at least one or more layers of the gate structure, such as a gate oxide and an overlying gate polysilicon layer or poly.

The angled channel implant can be achieved, for example, by angling or tilting the substrate relative to a direction of an ion beam from which ions are accelerated toward the substrate. Preferably, the acute angle is from between about 3° to about 60° relative to the surface normal, and more preferably is from about 10° to about 25°. Alternatively, for smaller angles, the ion beam itself may be steered using a magnetic field to achieve the desired implant angle.

Generally, the step of forming the channel 416 includes or is preceded by a step of forming a second photoresist mask 422 or channel mask on the surface 404 of the substrate 406 defining the channel 416. Shadowing by the second PR mask 416 in conjunction with the acute angle of the channel implant shadows the portion of the channel from at least some of the ions implanted to form the channel, thereby compensating for laterally scattered dopants from the well implant that would otherwise impact the $V_T$ of devices formed proximal to the well boundary. Although, the method is described and shown in the accompanying figures as separate channel and wells, it will be appreciated by those skilled in the art that a single PR mask combining well and channel features can be used, without departing from the scope of the present invention. Optionally, the method may include an additional mask stripping step between the well and channel implants to remove the well mask.

Preferably, the step of forming the channel 416, involves multiple implants between which the substrate 406 is twisted or rotated such that the region 416a of the channel 416 effected by lateral scattering of well implant is shadowed during only part of the total channel implant. This is indicated in FIG. 4B by two (2) complimentary sets of arrows 418, both forming the same angle with respect to the surface 404 or surface normal of the substrate 406, but pointing in opposing directions. Referring to FIG. 4B, it is seen that only a first portion of the channel implant, indicated by the group of arrows entering from the right, is shielded from the channel region 414 by the PR mask 422. Although, only two sets of arrows are shown for purposes of clarity, it will be understood that the channel implant can involve any number of separate implants between which the substrate 406 is re-positioned by twisting or rotating the tilted substrate about a rotation axis perpendicular to the surface 404 thereof.

Figure 5:
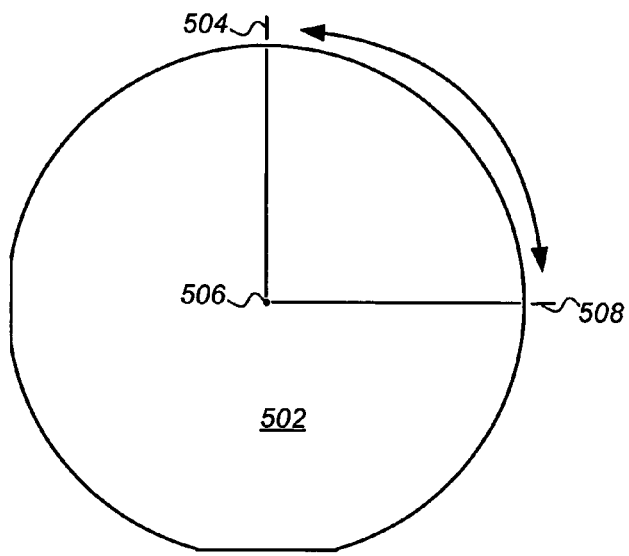
FIG. 5 is a plan view of a semiconductor substrate illustrating re-positioning or rotating or the substrate between angled partial implants of the channel according to an embodiment of the present invention.

For example, referring to FIGS. 3 and 5, in one embodiment a fraction of the total dose to be implanted equal to about the (total dose)/N is implanted while the tilted substrate 502 is oriented in a first position 504, and where N is a whole number greater than 1 (step 306). The substrate 502 is then rotated around a rotation axis 506 by 360/N degrees to a second position 508 and another fraction of a total dose, preferably equal to about the (total dose)/N implanted (step 308). The process is repeated until the substrate the total dose has been implanted (step 310). Thus, depending on the number and relative dose or duration of the portions of the channel implant, and a thickness of the second PR mask 422 the region 414 of the channel 416a effected by lateral scattering of the well implant may receive substantially all or merely a fraction of the total channel implant.

It will be appreciated that the reduction in the channel implant in the region 414 of the channel 416a effected by lateral scattering of the well implant is proportional to the number of partial or fractional implants separated by repositioning of the substrate from which the region 414 is shadowed. That is the channel implant for the region 414 of the channel 416a effected by lateral scattering is reduced by m/N, where N is the number of separate, distinct positions at which partial channel implants were performed, and m is a whole number between 1 and N−1 representing the number of partial implants during which the region is shadowed. For example, a typical channel implant to form an NMOS device in an Nwell involves implanting $B^+$ ions 412 at energy of from about 5 to about 50 KeV, and to a concentration or dose of from about 5e11 $cm^{-3}$ to about 5e13 $cm^{-3}$. Thus, performing two (2) partial channel implants at two different positions would result in about a 50% reduction in the channel implant for the region 414 of the channel 416a effected by lateral scattering. In one embodiment, initial tests for a given well implant, PR mask thickness and layout or proximity of devices to the well boundary are performed to determine the extent of the impact of lateral scattering on device $V_T$'s or performance, and the value of N chosen accordingly.

Preferably the channel implant includes at least four (4) separate, equal implants, and the substrate twisted or rotated about 90° between each implant. Alternatively, the channel implant includes from six (6) to eight (8) separate, equal implants, and the substrate is twisted or rotated between about 60° to about 45° between each implant to compensate for shadowing from substantially all well boundaries regardless of the orientation of the well boundaries and/or the channels of the devices.

Figure 6:
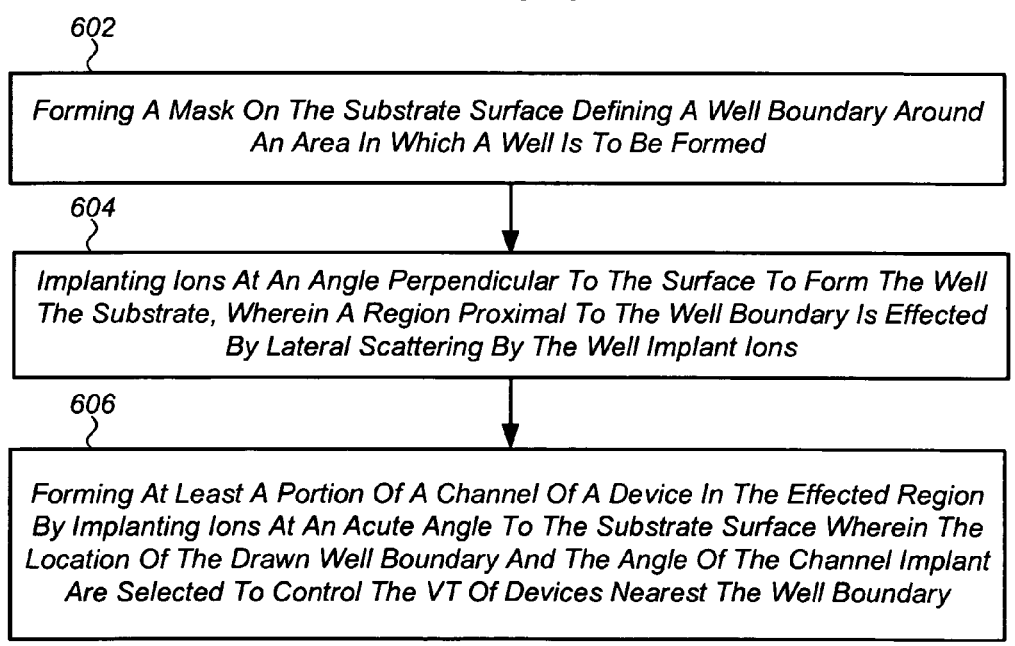
FIG. 6 is a flowchart of a method for manufacturing a circuit on a semiconductor substrate to control $V_T$ of devices in the circuit proximal to a well boundary according to another embodiment of the present invention.

In another embodiment, shown in FIG. 6, the present invention is directed to a method of manufacturing a CMOS circuit in which a location of the drawn well boundary is selected in conjunction with the angle by which the substrate 406 is tilted during in the channel implant to control or tailor $V_T$'s of devices in the circuit proximal to the well boundary. Generally, the method includes the steps of (i) forming a PR mask 422 on the surface 404 of the substrate 406 of a first conductivity type using a photolithographic process from a mask or reticle having a drawn well boundary, the PR mask defining a region on the substrate in which the well 408 is to be formed and at least one region in which a channel 416 of a device is to be formed (step 602); (ii) implanting ions into the substrate 406 at an angle substantially perpendicular to the surface thereof to form a well 408 of a second conductivity type in the substrate below the surface, at least a portion of the region 414 in which the channel 416a is to be formed proximal to the well boundary is effected by lateral scattering of the well implant from the PR mask (step 604); and (iii) forming at least a portion of a channel 416 of a device in the effected region 414 by implanting ions at an acute angle to the substrate surface 404 wherein the location of the drawn well boundary and the angle of the channel implant are selected to control the $V_T$'s of devices nearest the well boundary (step 606). In this embodiment, the angle by which the substrate 406 is tilted can be selected in conjunction with the proximity of the location of the drawn well boundary to the nearest device to be formed in the well 408. For example, the tilt of the substrate 406 or angle of the channel implant can be selected inversely proportional to the proximity of the drawn well boundary to the nearest device. Thus, the nearer the closest device to be formed in the well 408 is to the drawn well boundary, the more the substrate 406 is tilted to provide a larger angle of the channel implant relative to a surface normal of the surface 404 of the substrate.

As in the embodiments described above in connection with FIGS. 3 and 5, the substrate 406 can be rotated or twisted during the channel implant steps, such that the $V_T$'s of devices proximal to the well boundary are controlled or tailored by selecting the location of a drawn well boundary in conjunction with the angle by which the substrate is tilted, and the degrees by which it is rotated or twisted during in the channel implant.

It will appreciated that while characteristics (such as $V_T$) of devices located far away from the well boundary are not affected by the tilt or twisting of the substrate during the channel implant, the properties of the devices located near the well boundary can be precisely altered or tailored based on the proximity to the well, size of the device, and the values of the tilt and twist angles. Thus, the angle by which the substrate is tilted and the degrees by which it is rotated or twisted can be selected to adjust $V_T$'s of specific devices to enhance circuit performance.

For example, where the CMOS circuit includes a Static Random Access Memory (SRAM) including both n-MOSFET and p-MOSFET devices, the angle by which the substrate is tilted and the degrees by which it is rotated or twisted are selected to adjust $V_T$'s of the pass and latch field effect transistors (FETs) comprising the SRAM cell to enhance cell stability and/or cell read current.

Although the above methods of controlling or adjusting $V_T$'s of devices having channels formed near the well boundary have been described in detail with respect to certain preferred embodiments involving axial well implants and angled or tilted channel implants, it will be appreciated that other embodiments are possible without departing from the spirit and scope of the present invention. For example, the well implant may be performed at an angle similar to the channel implant described above, and with or without twisting or rotation of the substrate, while the channel implant is performed axially, or substantially perpendicular to the surface of the substrate. Alternatively, both the channel and the well implants could be performed at angles relative to the surface of the substrate. Finally, it will be appreciated that neither the angles or twisting of the substrate during implant, need be the same for the channel and well implants, and can be chosen to tailor the $V_T$'s of narrow channel devices near a well boundary.

Figure 7:
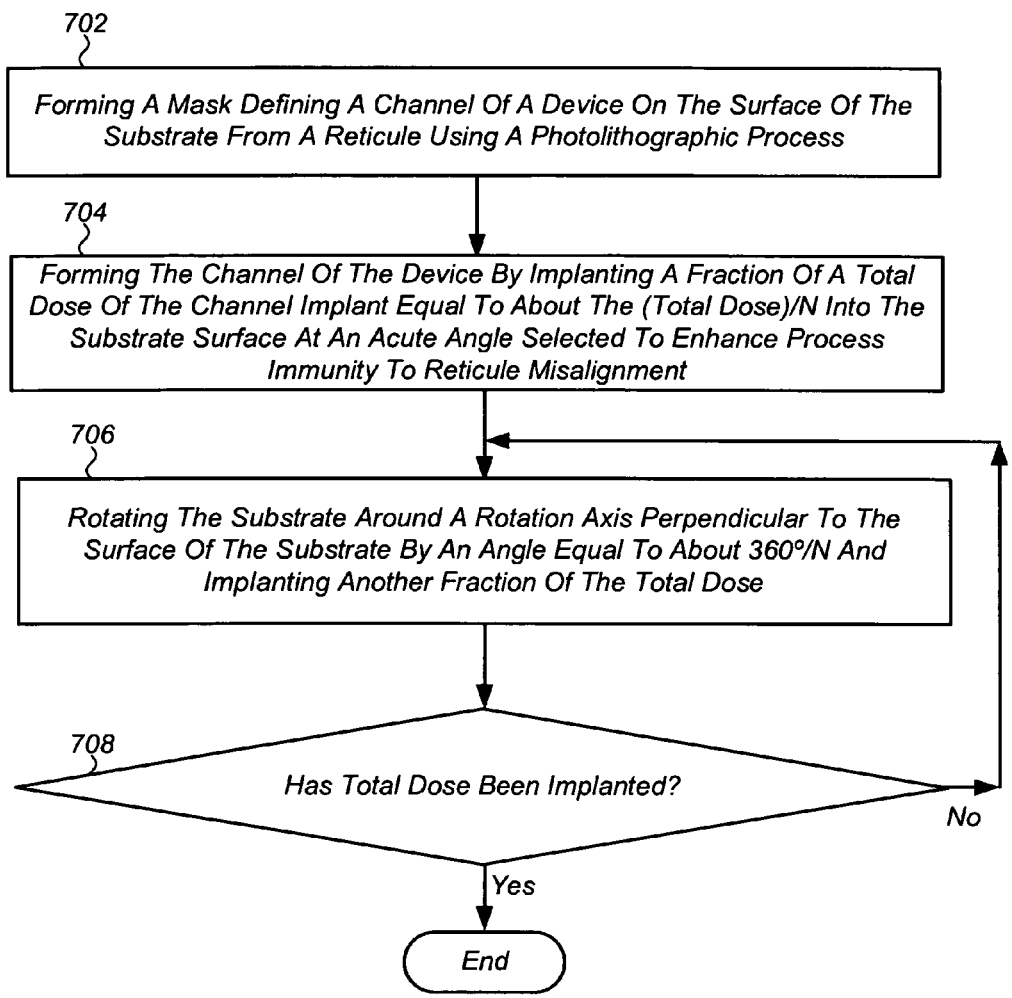
FIG. 7 is a flowchart of a method for manufacturing a circuit that enhances process immunity to reticule misalignment according to an embodiment of the present invention.

In another aspect the present invention is directed to a method of manufacturing a circuit that enhances process immunity to reticule misalignment. An embodiment of this method will now be described with reference to the flow chart of FIG. 7. Referring to FIG. 7, the method begins with forming a PR mask defining a channel of a device on the surface of the substrate from a reticule using a photolithographic process (step 702). The channel of the device is formed by implanting a first fraction of a total dose of the channel implant equal to about the (total dose)/N into the substrate surface at an acute angle, where N is a whole number greater than 1 (step 704). Next, the substrate is rotated around a rotation axis perpendicular to the surface of the substrate by an angle equal to about 360°/N and another fraction of the total dose implanted (step 706). The process is repeated until the substrate the total dose has been implanted (step 708). The acute angle of the channel implant and the number of separate, fractional implants is selected to enhance process immunity to reticule misalignment. Preferably the channel implant includes at least four (4) separate, equal implants, and the substrate twisted or rotated about 90° between each implant. Alternatively, the channel implant includes from six (6) to eight (8) separate, equal implants, and the substrate is twisted or rotated between about 60° to about 45° between each implant to compensate for shadowing from substantially all well boundaries regardless of the orientation of the well boundaries and/or the channels of the devices.

It will be appreciated that the above method to enhance process immunity to reticule misalignment is applicable both to devices formed in a well and those formed in an altered substrate. Where the device is formed in a well, it is applicable both to devices formed near the well boundary and those that are not.

The advantages of the method of the present invention over previous or conventional approaches include: (i) the ability to control parameters, e.g., $V_T$, of MOS devices near a well boundary, without the need for additional process steps, such as extra photolithography and/or implant steps; (ii) the ability to use drawn well boundary in conjunction with tilted channel implant to selectively control of $V_T$'s of narrow channel devices; (iii) the ability to independently adjust $V_T$'s of specific FETs (e.g. pass vs. latch transistors in a SRAM circuit) to enhance circuit performance, such as cell stability; and (iv) enhanced immunity of the process to mask misalignment in the well and channel implant steps due to the combination of implant tilt and twist.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. A method of manufacturing a complimentary metal-oxide semiconductor (CMOS) circuit on a semiconductor substrate of a first conductivity type to adjust threshold voltages ($V_T$) of devices in the circuit, the method comprising:
    forming a first photoresist mask on a surface of the substrate, the first photoresist mask defining a well boundary around an area in which a well is to be formed;
    implanting ions into the substrate at an angle substantially perpendicular to the surface of the substrate to form a well of a second conductivity type in the substrate, wherein a region proximal to the well boundary is effected by lateral scattering by the first photoresist mask of the ions implanted to form the well; and
    forming at least one of the devices in the region proximal to the well boundary which is effected by lateral scattering, wherein a channel of the device is formed by implanting ions into the substrate at an acute angle to the surface thereof to shadow the portion of the channel from at least some of the ions implanted to form the channel.

2. A method according to claim 1, wherein forming the channel of one of the devices comprises:
    implanting a first portion of a total dose to be implanted to form the channel;
    rotating the substrate around a rotation axis perpendicular to the surface of the substrate; and
    implanting a second portion of the total dose to be implanted.

3. A method according to claim 1, wherein the step of forming the channel of one of the devices comprises:
    implanting a fraction of a total dose to be implanted to form the channel equal to about the (total dose)/N, where N is a whole number greater than 1;
    rotating the substrate around a rotation axis perpendicular to the surface of the substrate by an angle equal to about 360°/N and implanting another fraction of the total dose equal to about the (total dose)/N; and
    repeating the rotating until the total dose has been implanted.

4. A method according to claim 3, wherein N is at least 4.

5. A method according to claim 3, wherein forming the channel comprises tilting the surface of substrate relative to a direction from which ions to be implanted are accelerated to implant ions into the substrate at an angle of from about 30° to about 60° to the surface thereof.

6. A method according to claim 5, wherein the angle by which the substrate is tilted and N are selected to control the $V_T$ of the device having a channel at least a portion of which is formed in the region proximal to the well boundary that is effected by lateral scattering.

7. A method according to claim 1, wherein forming at least a portion of a channel of at least one of the devices comprises forming a second photoresist mask on the surface of the substrate to define the channel of the at least one of the devices in the region proximal to the well boundary before implanting ions into the substrate to form the channel, and wherein the second photoresist mask shadows the portion of the channel from at least some of the ions implanted to form the channel.

8. A method according to claim 1, wherein forming a first photoresist mask on a surface of the substrate, comprises forming a first photoresist mask defining a well boundary around an area in which a well is to be formed, and defining the channel of the at least one of the devices in the region proximal to the well boundary before implanting ions into the substrate to form the well, and wherein the first photoresist mask shadows the portion of the channel from at least some of the ions implanted to form the channel.

9. A method of manufacturing a complimentary metal-oxide-semiconductor (CMOS) circuit including a number of devices on a semiconductor substrate of a first conductivity type, the method comprising:

forming a first photoresist mask on a surface of the substrate using a photolithographic process from a reticule having a drawn well boundary, the first photoresist mask defining a well boundary around an area in which a well is to be formed;

implanting ions into the substrate at an angle substantially perpendicular to the surface of the substrate to form a well of a second conductivity type in the substrate, wherein a region proximal to the well boundary which is effected by lateral scattering by the first photoresist mask of the ions implanted to form the well;

forming at least one of the devices in the region proximal to the well boundary which is effected by lateral scattering, wherein a channel of the device is formed by implanting ions into the substrate at an acute angle to the surface thereof to shadow the portion of the channel from at least some of the ions implanted to form the channel; and wherein the location of the drawn well boundary and the acute angle at which ions are implanted into the substrate to form the channel are selected to control threshold voltages ($V_T$) of devices in the circuit proximal to the well boundary.

10. A method according to claim 9, the acute angle at which ions are implanted into the substrate to form the channel is selected based on the location of the drawn well boundary, the further the drawn well boundary is away from the nearest of the devices the closer the acute angle is to perpendicular to the surface of the substrate.

11. A method according to claim 9, wherein forming the channel of one of the devices comprises:

implanting a fraction of a total dose to be implanted to form the channel equal to about the (total dose)/N, where N is a whole number greater than 1;

rotating the substrate around a rotation axis perpendicular to the surface of the substrate by an angle equal to about 360°/N and implanting another fraction of the total dose equal to about the (total dose)/N; and repeating the rotating until the total dose has been implanted.

12. A method according to claim 11, wherein N is at least 4.

13. A method according to claim 9, wherein forming the channel comprises tilting the surface of substrate at an angle of from about 3 to about 60 relative to direction from which ions to be implanted to form the channel are accelerated.

14. A method according to claim 9, wherein forming at least a portion of a channel of at least one of the devices comprises forming a second photoresist mask on the surface of the substrate to define the channel of the at least one of the devices in the region proximal to the well boundary before implanting ions into the substrate to form the channel, and wherein the second photoresist mask shadows the portion of the channel from at least some of the ions implanted to form the channel.

15. A method according to claim 9, wherein forming a first photoresist mask on a surface of the substrate, comprises forming a first photoresist mask defining a well boundary around an area in which a well is to be formed, and defining the channel of the at least one of the devices in the region proximal to the well boundary before implanting ions into the substrate to form the well, and wherein the first photoresist mask shadows the portion of the channel from at least some of the ions implanted to form the channel.

* * * * *